(12) United States Patent
Gelman (10) Patent No.: US 10,831,250 B2
(45) Date of Patent: Nov. 10, 2020

(54) IN-CIRCUIT SUPPLY TRANSIENT SCOPE

(71) Applicant: Chaoyang Semiconductor Jiangyin Technology Co., Ltd., Jiangyin (CN)

(72) Inventor: Anatoly Gelman, San Diego, CA (US)

(73) Assignee: Chaoyang Semiconductor Jiangyin Technology Co., Ltd., Jiangyin (CN)

( * ) Notice: Subject to any disclaimer, the term of this patent is extended or adjusted under 35 U.S.C. 154(b) by 43 days.

(21) Appl. No.: 15/894,820

(22) Filed: Feb. 12, 2018

(65) Prior Publication Data

US 2018/0232028 A1    Aug. 16, 2018

Related U.S. Application Data

(60) Provisional application No. 62/458,394, filed on Feb. 13, 2017.

(51) Int. Cl.
| | | |
|---|---|---|
| *G06F 1/28* | (2006.01) | |
| *G11C 5/14* | (2006.01) | |
| *G11C 8/04* | (2006.01) | |
| *H03K 23/40* | (2006.01) | |
| *G11C 7/22* | (2006.01) | |

(52) U.S. Cl.
CPC ............. *G06F 1/28* (2013.01); *G11C 5/147* (2013.01); *G11C 8/04* (2013.01); *G11C 7/222* (2013.01); *H03K 23/40* (2013.01)

(58) Field of Classification Search
CPC ........... G11C 5/147; G11C 7/222; G11C 8/04; H03K 23/40; G06F 1/28
See application file for complete search history.

(56) References Cited

U.S. PATENT DOCUMENTS

| | | | |
|---|---|---|---|
| 4,607,174 A | 8/1986 | Shoji et al. | |
| 6,989,692 B1 * | 1/2006 | Wong | H03K 5/08 327/77 |
| 7,003,421 B1 | 2/2006 | Allen, III et al. | |
| 7,348,836 B1 * | 3/2008 | Velmurugan | G06F 1/28 327/545 |
| 7,558,129 B2 * | 7/2009 | Thorp | G11C 5/145 365/189.07 |
| 2008/0136376 A1 | 6/2008 | Nebrigic et al. | |
| 2010/0020912 A1 * | 1/2010 | Lesso | H03L 7/087 375/376 |
| 2010/0169031 A1 | 7/2010 | Dishman et al. | |

(Continued)

FOREIGN PATENT DOCUMENTS

EP        2662791 A1    11/2013

OTHER PUBLICATIONS

Extended European Search Report (EESR) on related European Patent Application No. 18750621.7 from the European Patent Office (EPO) dated Jan. 7, 2020.

(Continued)

*Primary Examiner* — Terrell S Johnson (74) *Attorney, Agent, or Firm* — Klein, O'Neill & Singh, LLP (57) ABSTRACT

Temporal history of voltage supply level enveloping high-speed transient events is provided by circuitry on the same chip or in the same multi-chip module as the processor cores. In some embodiments supply voltage to the processor cores is compared to predetermined or programmable thresholds, and the result of the comparisons are stored for use by a host processor.

15 Claims, 7 Drawing Sheets

(56) References Cited

U.S. PATENT DOCUMENTS

| | | |
|---|---|---|
| 2010/0208789 A1 | 8/2010 | Cooke |
| 2013/0069707 A1 | 3/2013 | Chaudhry et al. |
| 2013/0093505 A1 | 4/2013 | Gupta et al. |
| 2013/0311799 A1 | 11/2013 | Fitzpatrick et al. |
| 2013/0318364 A1 | 11/2013 | Berry, Jr. et al. |
| 2014/0024145 A1 | 1/2014 | Bickford et al. |
| 2014/0281696 A1 | 9/2014 | Bacha |
| 2015/0286236 A1 | 10/2015 | Dornseifer et al. |
| 2016/0066280 A1 | 3/2016 | Heo et al. |
| 2016/0124481 A1 | 5/2016 | Avadhanam et al. |
| 2017/0075404 A1 | 3/2017 | Kitaji et al. |
| 2017/0187857 A1* | 6/2017 | Young .................. H03F 3/24 |
| 2017/0269155 A1 | 9/2017 | Honkote et al. |

OTHER PUBLICATIONS

International Search Report on related PCT Application No. PCT/US2018/017882 from International Searching Authority (KIPO) dated Jun. 1, 2018.

Written Opinion on related PCT Application No. PCT/US2018/017882 from International Searching Authority (KIPO) dated Jun. 1, 2018.

International Search Report on related PCT Application No. PCT/US2018/017856 from International Searching Authority (KIPO) dated May 21, 2018.

Written Opinion on related PCT Application No. PCT/US2018/017856 from International Searching Authority (KIPO) dated May 21, 2018.

Extended European Search Report on related European Patent Application No. 18751955.8 from the European Patent Office (EPO) dated Dec. 13, 2019.

U.S. Appl. No. 15/894,425, filed Feb. 12, 2018, Tanner Dosluoglu, US 2018-0232268 A1, Office Action dated Sep. 18, 2019, Response to Office Action dated Jan. 21, 2020, Notice of Allowance dated Mar. 25, 2020.

* cited by examiner

IN-CIRCUIT SUPPLY TRANSIENT SCOPE

CROSS REFERENCED APPLICATION

This application claims the benefit of the filing date of U.S. Provisional Patent Application No. 62/458,394, filed on Feb. 13, 2017, the disclosure of which is incorporated by reference in its entirety herein.

BACKGROUND

The present invention relates generally to power regulation for integrated circuits, and more particularly to monitoring of transient voltage excursions of supply voltage to integrated circuits.

Integrated circuits generally require provision of supply voltage within particular parameters during operation. The provision of such supply voltage may face many complexities. For example, semiconductor chips including the integrated circuits may have different portions that require power at the same or different times, different portions may require power within different parameters, and some portions may consume different amounts of power at different times.

Further complicating matters, some devices may be powered by batteries having relatively small capacities, while the devices themselves, at least at various times, may require large amounts of power. In such devices it may be beneficial to provide power only when needed, for example in order to lengthen effective battery life between charging. Unfortunately, the devices may quickly transition between a state requiring very little power to a state requiring large amounts of power. In such circumstances, a sudden change in magnitude of load current on a line or wire through which supply voltage is provided may result in transient effects that cause the provision of supply voltage outside the parameters required for, or desired for, proper operation of an integrated circuit or device.

Moreover, some integrated circuits may require certain minimum voltages for reliable operation, for example to meet setup time requirements for sequential logic. Failure to meet setup time requirements for sequential logic may have unintended effects, including possible incorrect logic operations, which may particularly affect central processing units (CPUs) and graphics processing units (GPUs). To avoid such situations, integrated circuitry may be designed so as to include a margin between an expected possible minimum supply voltage and a minimum voltage necessary for reliable operations. Unfortunately, modern CPUs and GPUs are often complex, with this complexity including numerous possible operating modes relating to power consumption, and it may be difficult to measure what may be an actual minimum supply voltage, particularly for transient occurrences. Furthermore, it is desirable to observe the supply transients in a fully enclosed mobile device without connecting external instrumentation like a scope and it desirable to capture supply voltage state at very fast sampling rate, >5 GHz in some implementations.

BRIEF SUMMARY OF THE INVENTION

Some embodiments in accordance with aspects of the invention provide on-device monitoring and recording of supply voltage values. In some embodiments a voltage supplied to integrated circuitry is compared to a plurality of thresholds, and results of the comparisons are written to memory. In some embodiments the comparison is performed by and the results of the comparisons written to elements on a same chip as the integrated circuitry. In some embodiments the comparison is performed by and the results of the comparisons written to elements on a same chip as a voltage regulator providing for regulation of the supply voltage. In some embodiments the comparison is performed by and the results of the comparisons written to elements on a module part of a same multi-chip module as the integrated circuitry.

In some embodiments a predefined number of memory elements are used to store the results of the comparisons. In some embodiments the memory elements are overwritten on a periodic basis with new values. In some embodiments the overwriting of memory elements is halted a predefined number of cycles, or a programmable number of cycles, after a triggering event. In some embodiments the triggering event is an indication by at least one of the comparators that the supply voltage is below a predetermined threshold, or in some embodiments a programmable threshold.

In some embodiments the comparators are clocked comparators. In some embodiments the comparators are clocked at a clock rate of the integrated circuitry or a clock rate of a dedicated clock source. In some embodiments the comparators are clocked at a clock rate of half of a clock rate of the integrated circuitry or a clock rate of a dedicated clock source. In some embodiments the memory elements are written every clock cycle, until writing of the memory elements is interrupted. In some embodiments the memory elements are written every other clock cycle, until writing of the memory elements is interrupted.

In some embodiments the memory elements are read by, or information of the memory elements is provided to, a host processor. In some embodiments the integrated circuitry comprises the host processor. In some embodiments the host processor comprises at least part of the integrated circuitry.

In some embodiments the host processor is a processor of a device including a display. In some embodiments the host processor is configured by program instructions to command display on a display of information of the memory elements. In some embodiments the host processor is part of a cellular telephone or a smartphone. In some embodiments the display is a display of the cellular telephone or smartphone.

Some embodiments include a supply transient scope (STS) block for monitoring a supply voltage provided to a load, comprising: a sensor array configured to receive a signal indicative of the supply voltage provided to the load, to compare the signal indicative of the supply voltage to each of a plurality of reference voltages, and to generate indications of the supply voltage based on results of the comparisons; and a memory including a plurality of memory elements configured to store at least some of the indications of the supply voltage generated by the sensor array.

Some embodiments include a method for generating indications of a supply voltage provided to a load comprising: receiving a signal indicative of the supply voltage provided to the load; comparing the supply voltage to each of a plurality of reference voltages, to generate a plurality of indications of the supply voltage; and temporarily storing at least some of the generated plurality of indications of the supply voltage in a memory.

Some embodiments include a system that provides an indication of a supply voltage supplied to a load comprising: a voltage regulator that provides the supply voltage to the load; and a supply transient scope (STS) block coupled to the voltage regulator in series with the load, the STS block comprising: a sensor array configured to receive an indication of the supply voltage provided to the load and compare the indication of the supply voltage to each of a plurality of reference voltages; and a memory including a plurality of memory elements configured to temporarily store results of the comparisons of the indication of the supply voltage to the reference voltages generated by the sensor array.

These and other aspects of the invention are more fully comprehended upon review of this disclosure.

DETAILED DESCRIPTION

Figure 1:
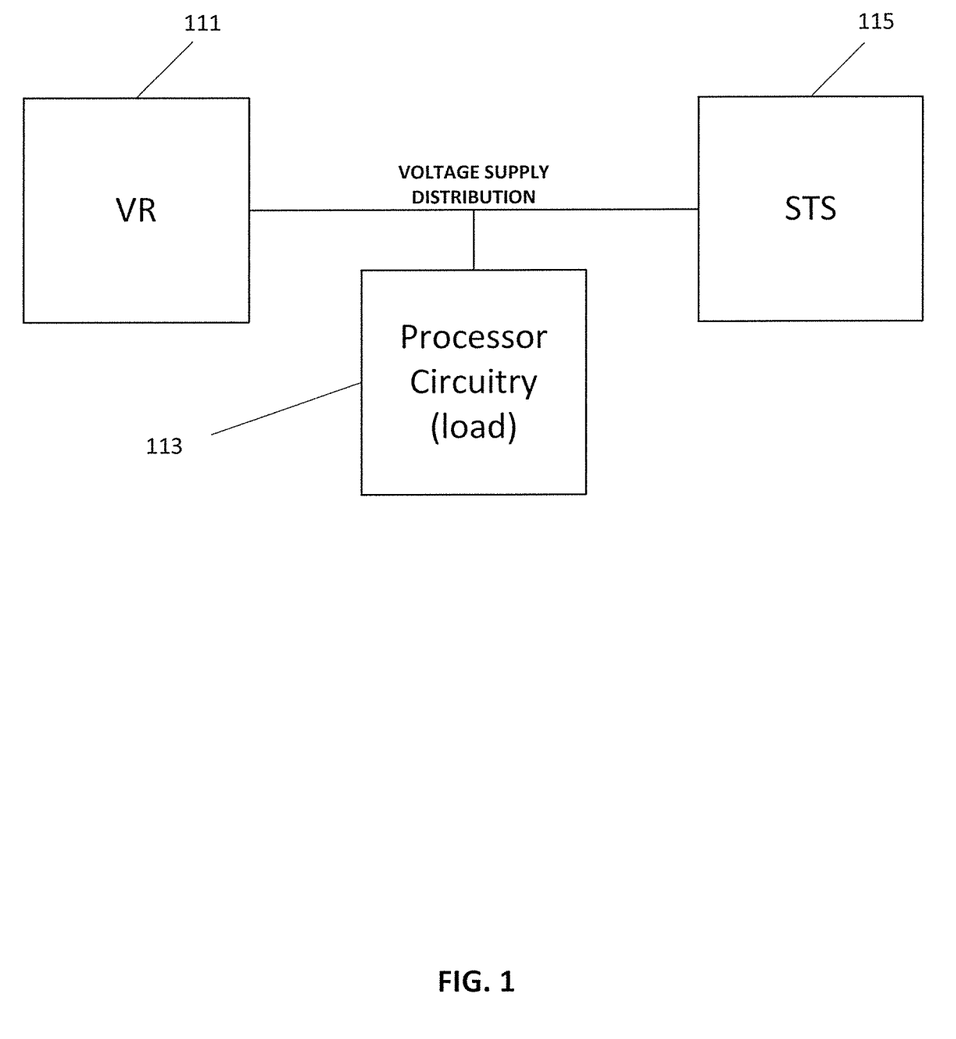
FIG. 1 is a block diagram of a system, or portions of a system, in accordance with aspects of the invention.

FIG. 1 is a block diagram of a system, or portions of a system, in accordance with aspects of the invention. In FIG. 1, a voltage regulator 111 provides regulated voltage to a load 113. In some embodiments the voltage regulator is on the same semiconductor chip as the load. In some embodiments the voltage regulator is in the same multi-chip module as the load. In some embodiments the voltage regulator and the load are coupled to the same substrate. In some embodiments the voltage regulator is a switching voltage regulator. In some embodiments the load includes, or is, a processor core, or part of a processor core. In some embodiments the processor core is part of a handheld device. In some embodiments power is provided to the voltage regulator by a battery, which is also part of the handheld device. In some embodiments the handheld device includes a display. In some embodiments the handheld device is a smartphone. In some embodiments the handheld device includes a cellular communication capability.

A supply transient scope block 115 is coupled to the load. The supply transient scope block receives an indication of voltage supplied to the load. As illustrated in FIG. 1 the supply transient scope block is coupled in series with the load. The supply transient scope block determines an indication of voltage level supplied to the load, and stores the indication of voltage level supplied to the load in memory. In some embodiments the indication of voltage supplied to the load is an indication of whether the voltage is below a specified voltage. In some embodiments the specified voltage is a predefined voltage. In some embodiments the specified voltage is a programmable voltage. In some embodiments, to reduce process and temperature variation of reference voltage, a bandgap circuit can be used as a reference voltage source. In various embodiments the indication of voltage level supplied to the load are indications of whether the voltage is below or higher than none, one, some, or all of a plurality of predefined or programmable voltages. In some embodiments the memory includes a limited amount of memory, with the memory being overwritten in a known way over time. In some embodiments the memory is a circular memory or buffer. In some embodiments the memory is a first in-first out buffer.

In some embodiments the supply transient scope block comprises a plurality of comparators, each comparing voltage supplied to the load to different voltage thresholds, and memory for storing results of the comparisons performed by the comparators. In some embodiments the comparators operate at a clock frequency the same as or similar to that of the load. In some embodiments the comparators operate at a fixed frequency without relation to frequency of the load. In some embodiments the comparators operate at a clock frequency twice that of the load. In some embodiments the comparators operate at a clock frequency twice that of the clock source independent of the load.

In some embodiments the supply transient scope block additionally includes logic circuitry to provide one or more signals to cease writing to the memory of the indication of voltage level supplied to the load. In some embodiments the logic circuitry receives a triggering signal indicating that retention in the memory of indication of voltage supplied to the load is desired. In some embodiments the retention signal is a signal from a one of the comparators that voltage supplied to the load is below a predefined or programmable value. In some embodiments the predefined or programmable value is a value below which the load, or some portion of the load, is not expected to or not guaranteed to properly perform sequential logic operations. In some embodiments the predefined or programmable value is a value below a setup time design requirement voltage for the load, or some portion of the load. In some embodiments the logic circuitry includes one or more counters to count a predefined or programmable number of clock cycles after receipt of the triggering signal, and to set the one or more signals to cease the writing to memory of the indication of voltage supplied to the load after the count reaches the predefined or programmable number of clock cycles. In such a situation, with the memory for example being a circular memory, the memory would retain information regarding voltage supplied to the load for a known number of last number of clock cycles.

In some embodiments the memory includes a read port, allowing for reading of the memory, for example by a host processor. In some embodiments the host processor may provide a signal to the logic circuitry indicating reading of the memory is complete, and the logic circuitry may include circuitry for deasserting the one or more signals to cease writing to the memory upon receipt of the signal. In some embodiments the host processor may be programmed, for example by way of program instructions, to command display of information reflecting the indication of voltage supplied to the load, for example on a display of the smartphone.

Figure 2:
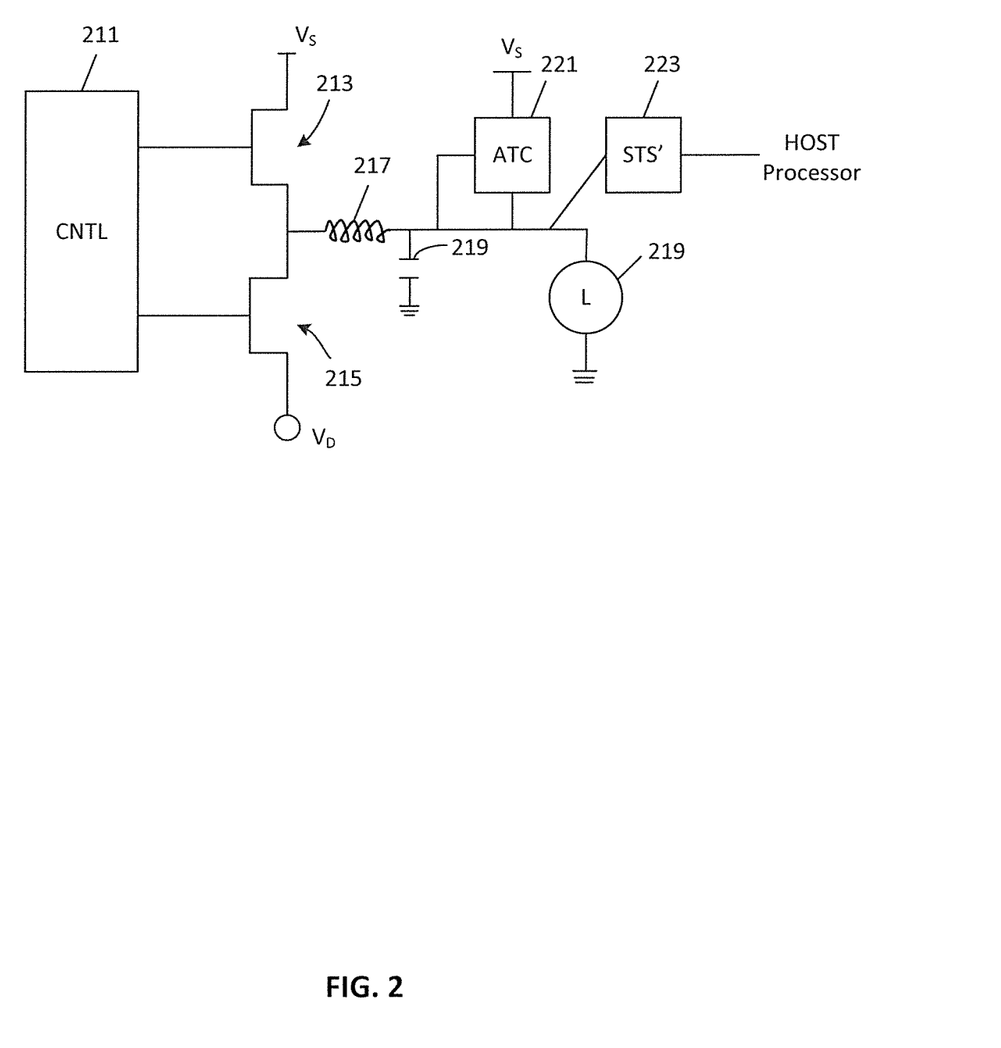
FIG. 2 is a semi-schematic, semi-block diagram of a voltage regulator and associated circuitry coupled to a load, in accordance with aspects of the invention.

FIG. 2 is a semi-schematic, semi-block diagram of a voltage regulator and associated circuitry coupled to a load, in accordance with aspects of the invention. In FIG. 2 a controller 211 generates signals to operate a high side switch 213 and a low side switch 215 of a DC-DC switching regulator. The high side switch and the low side switch are coupled in series between a higher voltage source Vs and a lower voltage source (or drain) Vd. In some embodiments the higher voltage source is provided by one terminal of a battery, and the lower voltage source is provided by another terminal of the battery. In some embodiments the lower voltage source is a ground, or may be considered to be a ground. In operation the controller sequentially activates the high side switch and then the low side switch, with generally only one of the two switches being active at any one time.

An inductor 217 has a first end coupled to a node between the high side switch and the low side switch, and a second end coupled to a load 219. An output capacitor 219 is coupled in parallel to the load. The load may be, for example, a processor core, or a load such as discussed with respect to FIG. 1.

In some embodiments, and as illustrated in FIG. 2, a transient control (ATS) circuit 221 may be coupled between the higher voltage source Vs and the load. The transient control circuit may be as discussed in U.S. Pat. No. 9,515,553, the disclosure of which is incorporated herein for all purposes. The transient control circuit includes circuitry for comparing voltage provided to the load with predetermined or programmable values, and for providing current to the load, in a ramped manner in some embodiments, when the voltage provided to the load is below at least some of those predetermined or programmable values.

An embodiment of a supply transient scope block 223 may be coupled to the transient control circuit. The supply transient scope block may receive outputs of at least some of the comparators of the transient control circuit. The supply transient scope block of FIG. 2, therefore, does not include all of the comparators of the supply transient scope block of FIG. 1. Instead, the supply transient scope block of FIG. 2 makes use of some comparators of, or associated with, the transient control block.

The supply transient scope block of FIG. 2 does, however, include memory for writing information from the comparators, and logic circuitry for determining when to cease, at least temporarily, writing of the information to the memory. In some embodiments the logic circuitry, and in some embodiments the memory, is as discussed with respect to FIG. 1.

Figure 3:
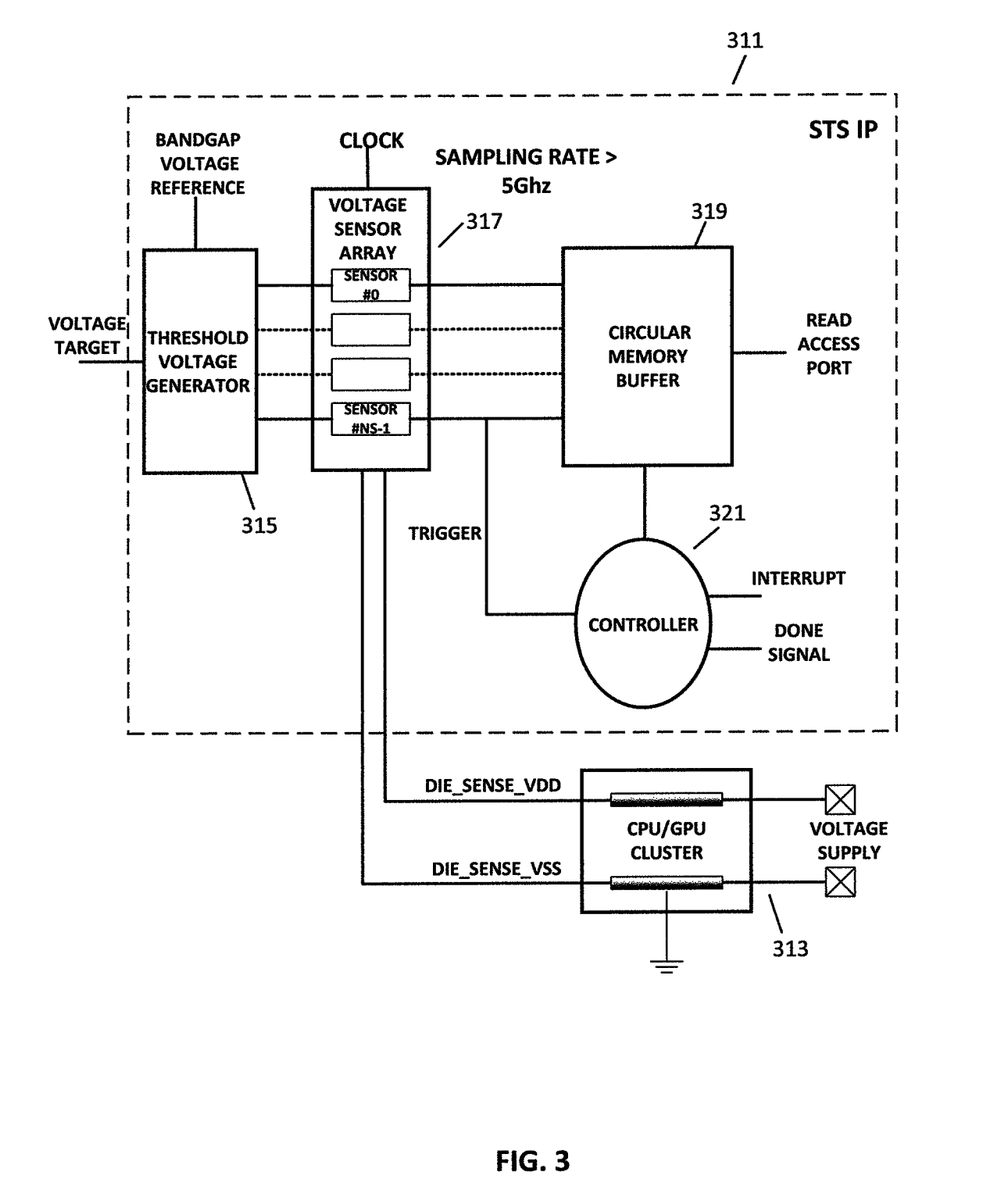
FIG. 3 is a block diagram of an example supply transient scope block and CPU/GPU cluster, in accordance with aspects of the invention.

FIG. 3 is a block diagram of an example supply transient scope block 311 and CPU/GPU cluster 313, in accordance with aspects of the invention. In some embodiments the CPU/GPU cluster are on a common semiconductor die. In some embodiments the supply transient scope block is also on the common semiconductor die. In some embodiments the supply transient scope block and the CPU/GPU cluster are in the same multichip module.

The CPU/GPU cluster receives power from a voltage supply. The power may be, and usually is, regulated power, for example as provided by a voltage regulator, which may be for example a DC-DC switching converter. In some embodiments, and as illustrated in FIG. 3, the power may be provided by way of VDD and VSS lines. The supply transient scope block receives signals indicative of voltages on the VDD and VSS lines. In some embodiments the signals are VDD and VSS signals. In some embodiments the signals are scaled or shifted versions of VDD and VSS, or one of them.

The signals indicative of VDD and VSS are provided to a voltage sensor array block 317. The voltage sensor array block includes an array of voltage sensors, with the voltage sensor array block 317 illustrated with an exemplary four voltage sensors. Each voltage sensor includes at least one element for comparing a reference voltage to a difference between the signals indicative of VDD and VSS, with generally each voltage sensor receiving a different reference threshold voltage. In some embodiments, for example embodiments in which the supply transient scope block and the CPU/GPU cluster share the same VSS signal, each sensor element may comprise a comparator. In various embodiments, however, each sensor element may comprise at least one comparator and other circuitry. In many embodiments the voltage sensors are clocked sensors. In some embodiments the sensors are clocked at clock rates comparable to clock rates of the CPU/GPU cluster, for example at a clock rate between half and twice the clock rate of the CPU/GPU cluster. In some embodiments the clock rate is in the range of 2-4 GHz, and in some embodiments the clock rate is 2.5 GHz, and in some embodiments the clock rate is greater than 4 GHz.

The voltage sensor array block receives threshold voltage signals from a threshold voltage generator 315. The threshold voltage generator generates threshold voltage signals at what may be considered threshold voltages of interest. For example, in some embodiments the threshold voltages of interest may include some voltages above a minimum voltage design specification for operation of the CPU/GPU cluster, and some voltages below the minimum voltage design specification for operation of the CPU/GPU cluster.

In the embodiment of FIG. 3, the threshold voltage generator receives a bandgap voltage reference signal and a voltage target signal. The threshold voltage generator uses the bandgap voltage reference signal, for example provided by a bandgap circuit, to generate threshold voltage signals at offsets to a voltage indicated by the voltage target signal. In other embodiments the threshold voltage generator may receive a plurality of voltage threshold indicator signals, with each of the voltage threshold indicator signals indicating a desired level for corresponding threshold voltage signals. In some embodiments the voltage target signal, or the voltage threshold indicator signals, may be stored in registers, which may be for example written to by a host processor.

Outputs of the sensors are written to a memory 319. In the embodiment of FIG. 3 the memory is a circular buffer, with later written information overwriting earlier written information in a first in, first out (or overwritten) circular manner. In some embodiments the memory includes sufficient memory elements to store 10 samples from each of the sensors. In some embodiments the memory includes sufficient memory elements to store 16 samples from each of the sensors. In some embodiments the memory includes sufficient memory elements to store 32 samples from each of the sensors. In some embodiments the memory includes sufficient memory elements to store 2 or more samples from each of the sensors. In some embodiments samples from the voltage sensors are written to the memory every clock cycle. In some embodiments samples from the voltage sensors are written to the memory every other clock cycle. In some embodiments samples from the voltage sensors are written to the memory every fourth clock cycle. In some embodiments samples from the voltage sensors are written to the memory upon the occurrence of a periodic programmable number of clock cycles.

A controller 321 performs logic operations. In some embodiments the controller comprises logic circuitry. In some embodiments the controller comprises processor elements configured by program instructions. In some embodiments the controller includes one or more counters.

In the embodiment of FIG. 3, the controller receives a trigger signal from the voltage sensor array. In some embodiments the trigger signal is an output of a one of the voltage sensors. In some embodiments, the trigger signal may be an output of a one of the voltage sensors which effectively compares the CPU/GPU supply voltage to a voltage determined to slightly above or at a voltage threshold below which proper operation of sequential logic of the CPU/GPU is not expected to be guaranteed. In some embodiments the trigger signal is an output of a one of the voltage sensors determined by a programmable register.

The controller uses the trigger signal to determine when to command the memory to cease writing memory elements, or to cease providing a signal to the memory allowing for writes to the memory elements. In some embodiments the trigger signal initiates a counting of clock cycles by the controller, with completion of the counting indicating that writes to the memory should cease. In some embodiments the controller counts 10 clock cycles, in some embodiments 16 clock cycles, in some embodiments 32 clock cycles, and in some embodiments a programmable number of clock cycles.

In addition, in the embodiment of FIG. 3, upon completion of the count, the controller also provides a DONE signal. The DONE signal may be used, for example, to indicate to a host processor that information regarding voltage supplied to the CPU/GPU cluster is available to be read from the memory. In some embodiments the controller thereafter waits a predetermined, or programmable, number of clock cycles, and then provides a signal to the memory allowing for further writing of samples from the voltage sensors. In some embodiments the controller waits for a signal from the host processor prior to allowing further writes to the memory.

Figure 4:
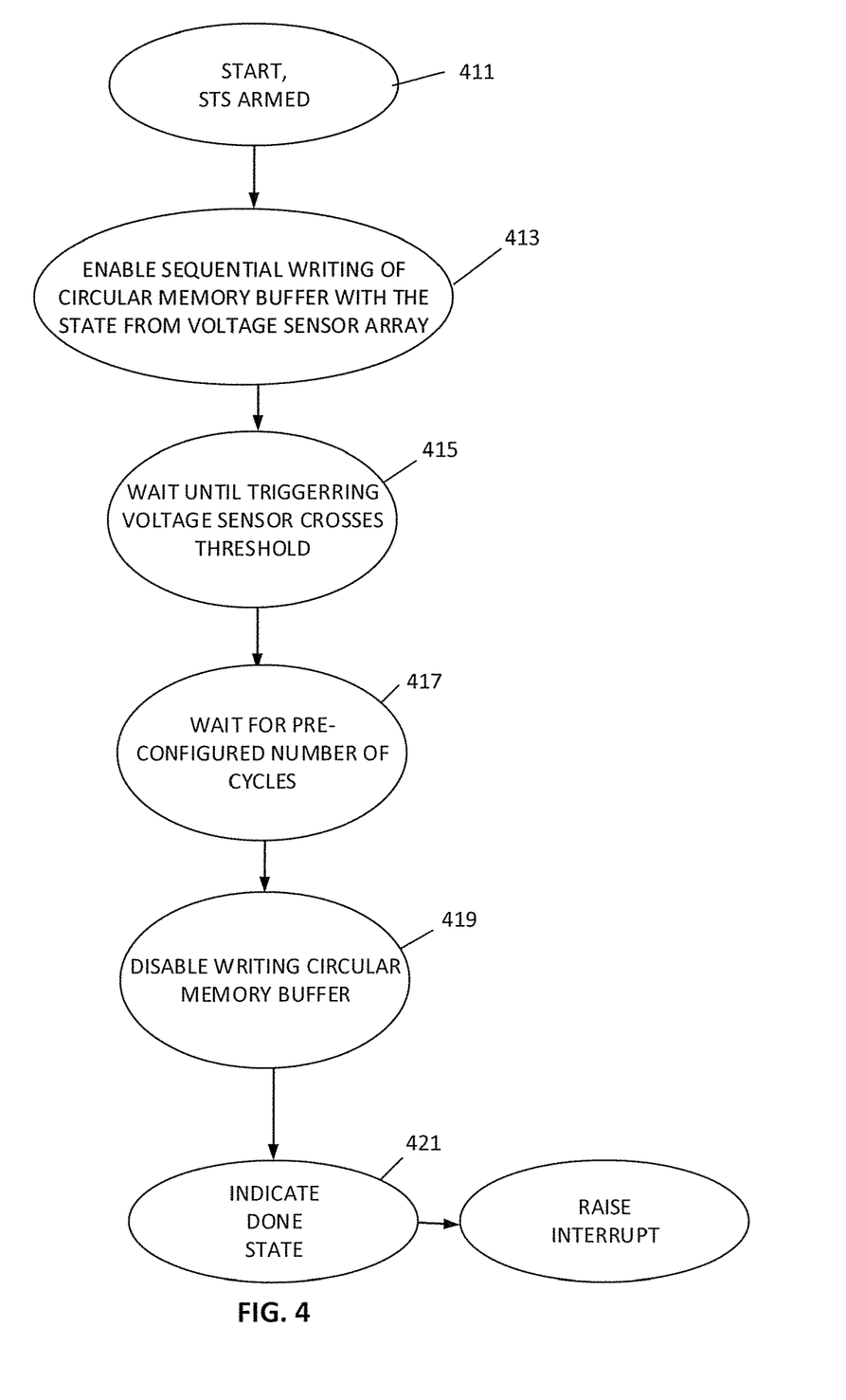
FIG. 4 is a flow diagram of a process for writing supply voltage information to memory, in accordance with aspects of the invention.

FIG. 4 is a flow diagram of a process for writing supply voltage information to memory, in accordance with aspects of the invention. In some embodiments the process is performed by the supply transient control block of FIG. 1, 2, or 3. In some embodiments the process is performed by a controller, for example the controller of FIG. 3.

In block 411 the process starts, and the supply transient control block may be considered to be armed. In block 413 the process enables writing of outputs, or states, from a voltage sensor array to memory, for example a circular memory buffer. The memory may be as discussed with respect to FIG. 1, 2, or 3. In some embodiments the process enables writing of the memory by providing a signal from the controller enabling writing to elements of the memory. The voltage sensor array may be as discussed with respect to FIG. 3, and the voltage sensor array may comprise a plurality of comparators comparing a supply voltage to a CPU or GPU to differing threshold voltages.

In block 415 the process waits for a triggering signal indicating that supply voltage to the CPU or GPU has fallen below a predetermined or programmable threshold. In some embodiments the triggering signal is provided by a predetermined or selected element of the voltage sensor array. In response to receiving the triggering signal, in block 417 the process waits for a predetermined, preconfigured, or programmable number of clock cycles. In some embodiments the process waits for the number of clock cycles by counting clock cycles, for example using counters.

In block 419, after waiting the number of clock cycles, the process disables writing of the outputs of the voltage sensors to the memory. In block 421 the process provides a DONE signal. The DONE signal may be provided, for example, to a host processor, or a register readable by the host processor. Additionally, an interrupt signal may be provided to the host processor.

Figure 5:
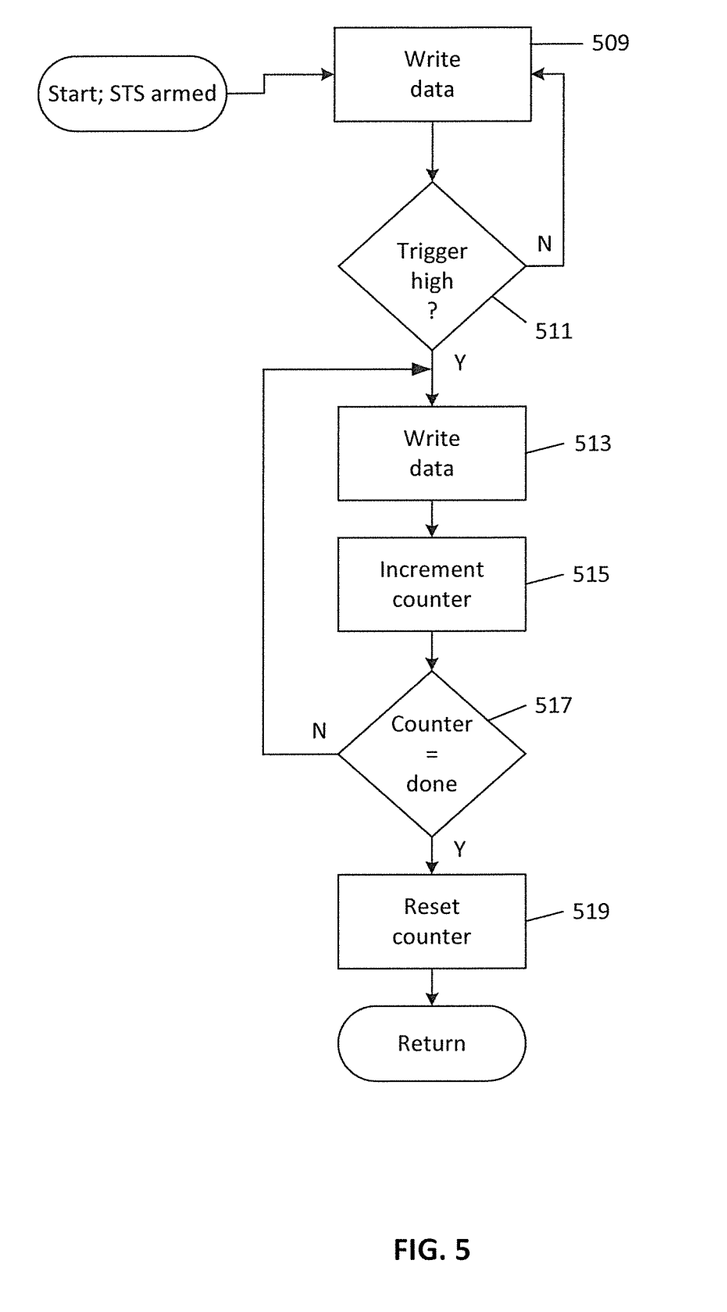
FIG. 5 is a flow diagram of an alternative process for writing supply voltage information to memory, in accordance with aspects of the invention.

FIG. 5 is a flow diagram of an alternative process for writing supply voltage information to memory, in accordance with aspects of the invention. In some embodiments the process is performed by the supply transient control block of FIG. 1, 2, or 3. In some embodiments the process is performed by a controller, for example the controller of FIG. 3.

In block 509 the STS is armed by host processor and a circular memory buffer begins to record a voltage sensor state.

In block 511 the process waits for a triggering signal. In some embodiments the triggering signal indicates that supply voltage to the CPU or GPU has fallen below a predetermined or programmable threshold. In some embodiments the triggering signal is provided by a predetermined or selected element of a voltage sensor array, for example the voltage sensor array of FIG. 3.

In block 513, after receiving the triggering signal, and in various embodiments responsive to receiving the triggering signal, the process writes data to memory, or allows for writing of data to memory. The data is data indicative of supply voltage level to a CPU or GPU. In various embodiments the data is provided by the voltage sensor array. In various embodiments the memory is a circular memory buffer.

In block 515 the process increments a counter. In block 517 the process determines if the counter is equal to a predetermined or programmable value. If not, the process returns to block 513. If the counter has reached the predetermined or programmable value, the process continues to block 519 and resets the counter. The process thereafter returns.

Figure 6A:
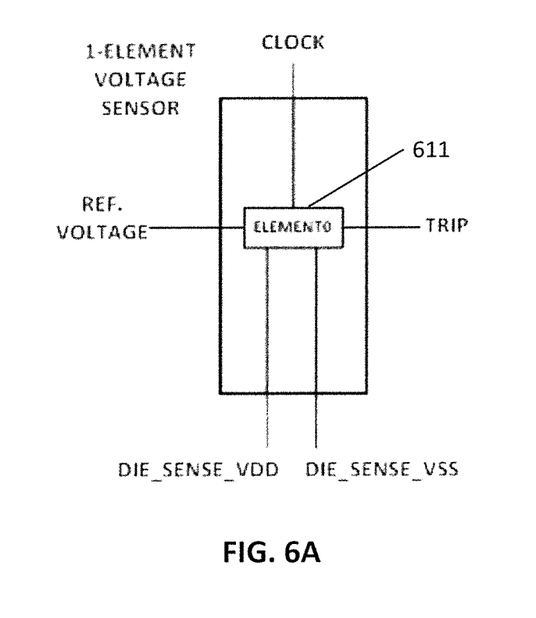
FIGS. 6A-C provide block diagrams of voltage sensors in accordance with aspects of the invention.
Figure 6B:
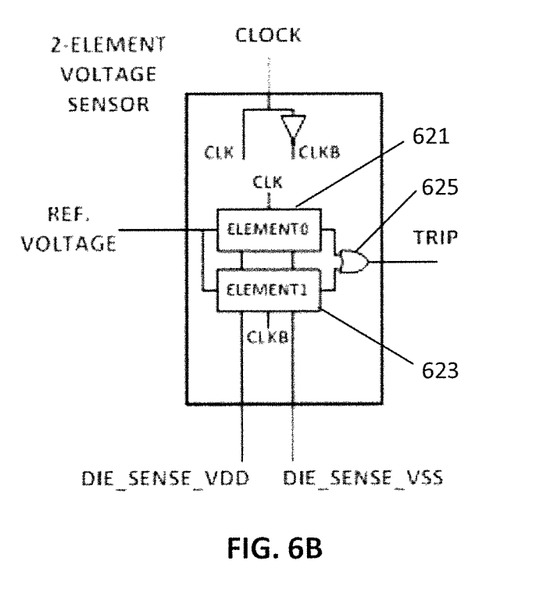
Figure 6C:
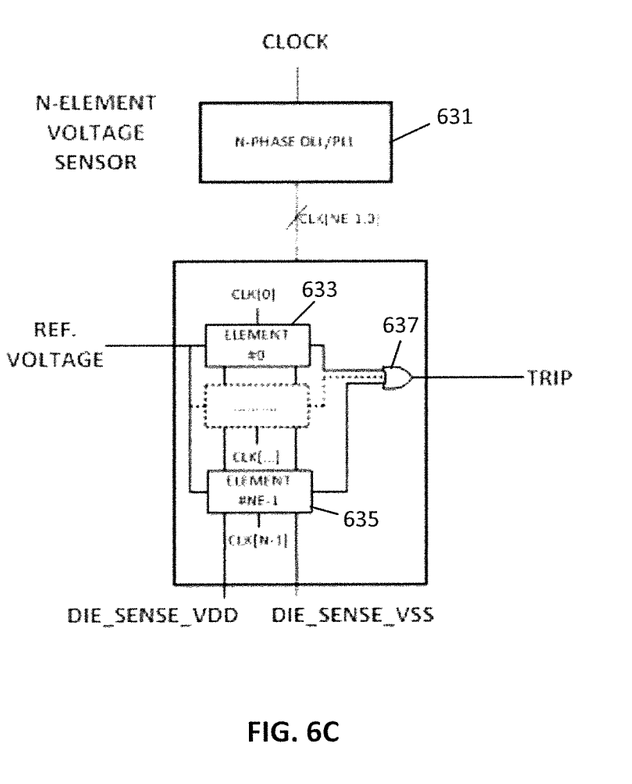

FIGS. 6A-C provide block diagrams of voltage sensors in accordance with aspects of the invention. In various embodiments the voltage sensors of FIGS. 6A-C may be used in the voltage sensor array of FIG. 3.

FIG. 6A illustrates a single element voltage sensor 611. The single element voltage sensor receives a reference voltage, and compares the reference voltage to an indication of supply voltage of a CPU/GPU cluster. The element performs the comparison on a clocked basis, and accordingly the element also receives a clock signal. If the reference voltage is greater than the indication of supply voltage of the CPU/GPU cluster, the element provides a trip signal.

FIG. 6B illustrates a dual element voltage sensor. The dual element voltage sensor includes a first element 621 and a second element 623. The dual element voltage sensor receives a reference voltage, and each of the elements compares the reference voltage to an indication of supply voltage of a CPU/GPU cluster. The elements perform the comparison on a clocked basis, and accordingly the element also receives a clock signal. In the embodiment of FIG. 6B, the dual element voltage sensor is shown as including an inverter to invert the clock signal, with the clock signal being provided to the first element and the inverse of the clock signal being provided to the second element. Outputs of the elements are provided to an OR gate 625. If the reference voltage is greater than the indication of supply voltage of the CPU/GPU cluster, the OR gate of the element provides a trip signal. The two elements operating on opposite edges of the clock to effectively provide a trip indication every half cycle, compared to providing a trip indication every cycle as illustrated by FIG. 6A.

FIG. 6C illustrates an n-element voltage sensor, n greater than 2. The n-element voltage sensor is similar to the dual element voltage sensor, but with n elements, instead of only two elements. Accordingly, the n-element voltage sensor includes a first element 633, and other elements until an nth element 635. As with the dual element voltage sensor, outputs of the elements are provided to an OR gate 637, which provides the trip signal. In addition, to provide a sufficient number of rising clock edges, an n-phase DLL or PLL 631, or a delay line in some embodiments, is used to provide n rising clock edges.

Although the invention has been discussed with respect to various embodiments, it should be recognized that the invention comprises the novel and non-obvious claims supported by this disclosure.

What is claimed is:

1. A supply transient scope (STS) block for monitoring a supply voltage provided to a load, comprising:
a sensor array configured to receive a signal indicative of the supply voltage provided to the load, to compare the signal indicative of the supply voltage to each of a plurality of reference voltages, and to generate indications of the supply voltage based on results of the comparisons;
a memory including a plurality of memory elements configured to store at least some of the indications of the supply voltage generated by the sensor array based on a clock cycle; and
control circuitry configured to generate a stop signal, and wherein the memory is configured to cease writing the at least some indications of the supply voltage to the plurality of memory elements upon receipt of the stop signal; and
wherein the control circuitry is configured to generate the stop signal a predetermined plurality of clock cycles after one of the indications of the supply voltage generated by the sensor array indicates the supply voltage is below a predetermined value.

2. The STS block of claim 1 wherein the sensor array includes a plurality of comparators, each of the plurality of comparators configured to compare the signal indicative of the supply voltage to one of the plurality of reference voltages.

3. The STS block of claim 2 further comprising:
a threshold voltage generator configured to generate the plurality of reference voltages based on a target voltage.

4. The STS block of claim 2 wherein each of the plurality of comparators are clocked comparators clocked at a clock rate comparable to a clock rate of the load.

5. The STS block of claim 3 wherein the threshold voltage generator is configured to generate the plurality of reference voltages based on a bandgap reference voltage and the target voltage.

6. The STS block of 1 wherein the plurality of memory elements include a sufficient number of memory elements to store at least two results from each of comparisons of the signal indicative of the supply voltage to the plurality of reference voltages.

7. The STS block of claim 1 wherein the memory is a circular buffer.

8. A method for generating indications of a supply voltage provided to a load comprising:
receiving a signal indicative of the supply voltage provided to the load;
repeatedly over time, comparing the supply voltage to each of a plurality of reference voltages; and
temporarily storing in memory at least some results of the comparing of the supply voltage to each of the plurality of reference voltages, the stored results including at least a plurality of results for each of the plurality of reference voltages; and
halting writing of the at least some of the results a predetermined plurality of clock cycles after a one of the results indicates the supply voltage is below a predetermined value.

9. The method of claim 8 further comprising:
receiving a target voltage signal; and
generating the plurality of reference voltages based on the target voltage signal.

10. The method of claim 9 further comprising:
receiving bandgap reference voltage signal; and
wherein the plurality of reference voltages are generated based upon the target voltage signal and the bandgap reference voltage signal.

11. The method of claim 8 wherein the comparisons are performed at a clock rate comparable to a clock rate of the load.

12. The method of claim 8 further comprising:
waiting a predetermined number of clock cycles to allow a host processor to read the memory; and
re-starting the storing in memory of the at least some of the results in response to the predetermined number of clock cycles having passed.

13. A system that provides an indication of a supply voltage supplied to a load comprising:
a voltage regulator that provides the supply voltage to the load; and
a supply transient scope (STS) block coupled to the voltage regulator in series with the load, the STS block comprising:
a sensor array configured to receive an indication of the supply voltage provided to the load and to compare the indication of the supply voltage to each of a plurality of reference voltages;
a memory including a plurality of memory elements configured to temporarily store a plurality of results for each of the comparisons of the indication of the supply voltage to each of the plurality of the reference voltages generated by the sensor array; and
control circuitry configured to at least temporarily halt the memory from storing further results of the comparisons a predetermined value of clock cycles after a one of the sensors of the sensor array indicated that the supply voltage is below a predetermined value.

14. The system of claim 13 wherein the load and the STS block are on the same chip.

15. The system of claim 13 wherein the load and the STS block are in the same chip module.

* * * * *

UNITED STATES PATENT AND TRADEMARK OFFICE
CERTIFICATE OF CORRECTION

PATENT NO. : 10,831,250 B2
APPLICATION NO. : 15/894820
DATED : November 10, 2020
INVENTOR(S) : Anatoly Gelman Page 1 of 1

It is certified that error appears in the above-identified patent and that said Letters Patent is hereby corrected as shown below:

In the Claims

Column 9, Line 45, Claim 6, after "of" insert --claim--, therefor.

Signed and Sealed this
First Day of June, 2021

Drew Hirshfeld
*Performing the Functions and Duties of the*
*Under Secretary of Commerce for Intellectual Property and*
*Director of the United States Patent and Trademark Office*